US006449567B1

(12) United States Patent
Desai et al.

(10) Patent No.: US 6,449,567 B1
(45) Date of Patent: Sep. 10, 2002

(54) APPARATUS AND METHOD FOR DETERMINING SHAFT SPEED OF A MOTOR

(75) Inventors: Binish P. Desai, Secane; Martin J. Dowling, Norristown, both of PA (US)

(73) Assignee: Crane Nuclear, Inc., Kennesaw, GA (US)

( * ) Notice: Subject to any disclaimer, the term of this patent is extended or adjusted under 35 U.S.C. 154(b) by 0 days.

(21) Appl. No.: 09/181,149

(22) Filed: Oct. 27, 1998

Related U.S. Application Data

(63) Continuation-in-part of application No. 08/650,228, filed on May 20, 1996, now Pat. No. 6,144,924.

(51) Int. Cl.[7] .............................................. G06F 19/00
(52) U.S. Cl. ........................... 702/58; 702/145; 702/64; 318/490; 324/772
(58) Field of Search ............................... 702/58, 60, 64, 702/65, 109, 115, 183, 185, 57, 59, 62, 72, 182, 184, 198, 75–77, 78, 124, 126, 145–148, 189, FOR 103, FOR 104, FOR 106, FOR 111, FOR 170, FOR 171, FOR 107, FOR 108, FOR 109, FOR 134, FOR 155, FOR 113; 324/772, 160, 161, 177, 166; 318/800, 803, 565, 640, 563, 564, 650, 490; 388/916, 907.5, 909, 30, 31, 33; 340/648, 660, 664, 657, 658; 700/304, 297, 298, 292–294, 286, 287, 290

(56) References Cited

U.S. PATENT DOCUMENTS 5,270,640 A    12/1993  Kohler et al. ................ 324/772
5,514,978 A     5/1996  Koegl et al. ................. 324/772
5,519,337 A  *  5/1996  Casada ....................... 324/772
5,578,937 A  * 11/1996  Haynes et al. .............. 324/772
5,680,025 A  * 10/1997  Bowens, III et al. ....... 318/490
5,742,522 A  *  4/1998  Yazici et al. ................ 324/772

OTHER PUBLICATIONS

"Conference Record of the 1989 IEEE Industry Applications society Annual Meeting Annual Meeting Part II", Papersz presented at the 1898798 Industry Applications Society, pp. 1580–1586.

"Current Practices and Trends in Mechanical Failure Prevention", Proceedings of the 44th Meeting of the Mechanical Failures Prevention Group, Apr. 3–5, 1990. compiled by Henry C. Pusey and Sallie C. Pusey, a publication of the Vibtation Institute, pp. 96–109.

IEEE Standard Test Procedure for Polyphase Induction Motors and Generators, IEEE Std 112–1996 (Revision of IEEE Std 112–1991). (No Month).

* cited by examiner

Primary Examiner—Hal Wachsman
(74) Attorney, Agent, or Firm—Womble Carlyle Sandridge & Rice, PLLC

(57) ABSTRACT

Briefly stated the motor speed monitor includes a method of determining a shaft speed of a motor by using an electrical signature of the motor. The method includes: (a) sensing an electrical current supplied to the motor to generate a current sensor output signal for at least one electrical phase of the motor; (b) demodulating the current sensor output signal for a predetermined time interval to obtain an instantaneous amplitude of the electrical current signal; (c) generating a frequency spectrum of the instantaneous current amplitude; (d) finding at least one spectral peak of the instantaneous current amplitude frequency spectrum within a predetermined shaft frequency sideband range; (e) estimating a shaft frequency from the at least one spectral peak and converting the shaft frequency to shaft speed.

11 Claims, 6 Drawing Sheets

APPARATUS AND METHOD FOR DETERMINING SHAFT SPEED OF A MOTOR

CROSS REFERENCE TO RELATED APPLICATIONS

This application is a continuation-in-part of U.S. patent application Ser. No. 08/650,228, filed May 20, 1996, now U.S. Pat. No. 6,144,924. This application is related to U.S. patent application No. 09/019,259, filed Feb. 5, 1998, now U.S. Pat. No. 6,128,583.

BACKGROUND OF THE INVENTION

The present invention relates to an electrical measuring and testing device and method and more particularly to a device and method for precisely and remotely determining the speed of a single-phase or polyphase induction motor.

Electrical motors play a key role in industry, providing the driving torque for fans, pumps, compressors, valves, and many other machines. It is potentially very costly to allow a significant problem to go on unnoticed in the motor, just as it is costly to attempt to repair a nonexistent problem. A parameter that must be known for field evaluation of motors is motor shaft speed or equivalently slip, where slip and shaft speed are related by the expression:

Slip=1−(Shaft Speed/Synchronous Speed)

For example, motor shaft speed must be known in order to determine motor efficiency. Thus the accurate measurement of motor shaft speed is very important for on-line evaluation of motor condition.

Typically a tachometer is used for field measurement of motor shaft speed. One implementation of a tachometer monitors the response of a magnetic pickup or an eddy current probe to a shaft keyway as the keyway passes the pickup or probe. Another implementation senses the reflection of a light beam off of a piece of reflective tape bonded to a shaft. Yet another implementation employs a coil to sense a magnet attached to a shaft. In any of these methods a signal is generated each time the shaft revolves, the resulting signal frequency being the frequency of shaft revolution. There are several problems with these methods, e.g.: a) the motor must be stopped in order to bond the magnet or reflective tape to the shaft; b) attached magnets can become loose over time; c) light reflectors become dirty, disrupting the optical signal; d) in many cases the motor shaft is not easily accessible, having a very short exposed surface or covered by a protective housing; e) in cases where the shaft is accessible, the placement of the eddy current or optical probe can be problematic, getting in the way of routine inspections and maintenance; f) eddy current, optical and other externally added probes jut out from the natural contour of the machine, becoming exposed to the constant risk of being knocked out of alignment (and thus operation) during routine inspection and maintenance; and g) a tachometer requires running cables from the motor back to a central monitoring location, typically the MCC (Motor Control Center).

The ideal speed monitor is non-intrusive, accurate, reliable, capable of remote operation, and not dependent on attachments to the shaft or probes which jut out from the machine. Furthermore, speed monitor sensors should be relatively inexpensive and not require calibration.

The referenced invention disclosed in U.S. Pat. No. 6,144,924 overcame most of the aforementioned problems by determining shaft speed from an analysis of the motor current signal alone. Subsequent testing has revealed that the referenced invention does not accurately detect shaft speed for some conditions. This new invention refines the technique of shaft speed determination by taking into account both motor voltage and current information.

BRIEF SUMMARY OF THE INVENTION

Briefly stated the motor speed monitor comprises a method of determining a shaft speed of a motor by using an electrical signature of the motor. The method comprises: (a) sensing an electrical current supplied to the motor to generate a current sensor output signal for at least one electrical phase of the motor; (b) demodulating the current sensor output signal for a predetermined time interval to obtain an instantaneous amplitude of the electrical current signal; (c) generating a frequency spectrum of the instantaneous current amplitude; (d) finding at least one spectral peak of the instantaneous current amplitude frequency spectrum within a predetermined shaft frequency sideband range; (e) estimating a shaft frequency from the at least one spectral peak; and (f) converting the shaft frequency to shaft speed.

Another aspect of the motor speed monitor comprises a method of determining a shaft speed of a motor by using an electrical signature of the motor. The method comprises: (a) sensing an electrical voltage supplied to the motor to generate a voltage sensor output signal for at least one electrical phase of the motor; (b) sensing an electrical current supplied to the motor to generate a current sensor output signal for at least one electrical phase of the motor; (c) demodulating the voltage sensor output signal for a predetermined time interval to obtain an instantaneous phase of the voltage sensor output signal; (d) demodulating the current sensor output signal for a predetermined time interval to obtain an instantaneous phase of the current sensor output signal; (e) subtracting the instantaneous phase of the current sensor output signal from the instantaneous phase of the voltage sensor output signal to obtain an instantaneous difference angle; (f) generating a frequency spectrum of the instantaneous difference angle; (g) finding at least one frequency peak of the instantaneous difference angle frequency spectrum within a predetermined pole pass frequency sideband range; (h) estimating a pole pass frequency from at least one spectral peak; and (i) converting the pole pass frequency to shaft speed.

A further aspect of the motor speed monitor comprises a method of determining a shaft speed of a motor by using an electrical signature of the motor. The method comprises the steps of: (a) estimating a shaft frequency by measuring at least one first spectral peak location in a first frequency spectrum of an amplitude demodulated motor electrical current; (b) estimating a pole pass frequency by measuring at least one second spectral peak location in a second frequency spectrum of the difference between a phase demodulated motor electrical current and a phase demodulated motor electrical voltage; (c) measuring the consistency of the shaft frequency and the pole pass frequency estimates respectively by comparing the location of the first and second spectral peaks in at least one motor phase; (d) calculating and outputting the shaft speed based on the most consistent of the shaft frequency and the pole pass frequency estimates; (e) calculating and outputting the shaft speed as the average of a first shaft speed calculated from the shaft frequency estimate and a second shaft speed calculated from the pole pass frequency estimate if the shaft speed estimate and the pole pass frequency estimate are equally consistent and if the first shaft speed differs from the second shaft speed by less than a predetermined limit; and (f) not outputting the shaft speed if the shaft frequency and the pole pass frequency are equally consistent and if the first shaft speed differs from the second shaft speed by a value equal to or greater than a predetermined limit.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
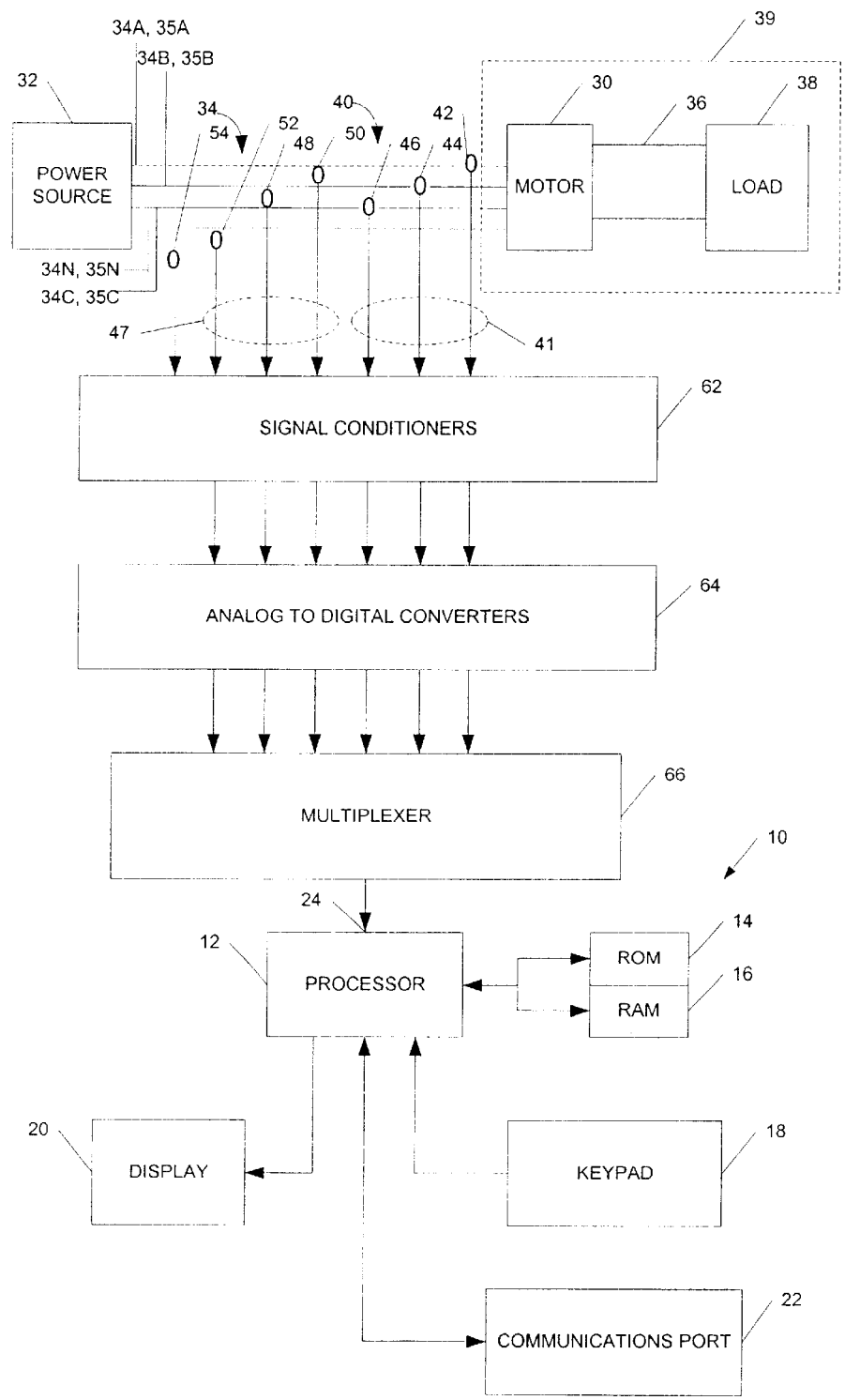
FIG. 1 is a functional schematic block diagram of a preferred embodiment of a system for determining the rotor speed and slip in a polyphase motor in accordance with the present invention.

Referring to the drawings, where like numerals are used to indicate like elements throughout, there is shown in FIG. 1 a functional schematic block diagram of a preferred embodiment of a processor-based motor monitor system 10 which operates in accordance with the methods of the present invention. In the presently preferred embodiment, the system 10 includes a processor 12 which preferably is a commercial microprocessor, such as an Intel x86 type processor or similar processor, although other processors may also be used with the present invention, such as a digital signal processor, as are known to those of ordinary skill in the art of data collection devices. Preferably the processor 12 includes or has access to a memory, which preferably includes a read only memory (ROM) 14 employed for storing fixed information, such as executable processor code and/or fixed data parameters or parameter ranges, and a random access memory (RAM) 16 of a predetermined size which is adapted for temporary storage of data accumulated for analysis. The ROM 14 is of a type well known to those of skill in the art for storing fixed information or information which is not changed by the processor 12 during execution of processor operations. However, the ROM 14 may be of the type which can be reprogrammed (e.g., a PROM, EPROM, EEPROM, etc.) or otherwise changed periodically to update, modify or change how the processor 12 operates.

The RAM 16 may also be used for temporarily storing portions of the executable code or input information. As will also be known to those of ordinary skill in the art, other memory devices could also be connected to the processor 12, such as a magnetic or optical storage device, or a PCMCIA compatible storage device (not shown) for storing collected and/or processed data and related information, such as a time stamp.

Some of the components of the motor monitor system 10 shown in FIG. 1, such as the keypad 18 and communications port 22, may not be necessary for the simplest implementation in which a physical embodiment of the invention is preprogrammed and permanently placed in a monitoring location for the purpose of displaying motor speed only. However, the motor speed monitor performance, such as the invention described in U.S. Pat. No. 6,144,924, and thus will require more sophisticated human and electronic interfacing means such as provided by the keypad 18 and communications port 22. The keypad 18 and communications port 22 are also useful in the simplest implementation because they provide a means for upgrading the software and for querying historical data and motor speed monitor system 10 settings such as threshold parameters.

In the preferred embodiment a keypad 18 is presently employed as the primary user input device to permit a user to communicate with the processor 12. The keypad 18 includes a plurality of buttons or switches for inputting information or commands. In the presently preferred embodiment, the keypad 18 includes buttons for instructing the system 10 to display previously recorded or stored data, such as motor speed. The keypad 18 also preferably includes one or more buttons related to motor identification information. Although a keypad 18 is presently preferred, it will be appreciated by those skilled in the art that any other type of input device may be employed instead of or in addition to the keypad 18, such as a keyboard, mouse or track ball type device which allows a user to scroll through predetermined command screens, as is known in the art.

In the preferred embodiment a display 20 is connected to the processor 12 for displaying output from the processor 12. The display 20 provides motor speed information to a user, as well as displaying other motor monitoring features that may be added, such as an event flag for alerting the user when the motor is stopped or operating outside an acceptable speed range. In the presently preferred embodiment, the display 20 comprises a liquid crystal display (LCD) in combination with an array of light emitting diodes (LEDs). The LCD displays motor speed information and the LEDs display event flags for alerting the user to potential problems such as motor stoppage or operation at speeds outside of acceptable limits. Other types of suitable output devices may be employed in addition to or instead of the display 20, such as a cathode ray tube (CRT) or a printer. In addition to the display 20, a remote display (not shown) may be included which is situated at another location.

In the preferred embodiment the processor 12 further includes at least one communication port 22 which may be either a parallel port, a serial port, or both. The communication port 22 is employed for receiving data from another location or device, for transmitting data to another device or for sending data to another location utilizing a modem or other such transmission device (not shown) in a manner well known in the computer art. In the presently preferred embodiment, the communication port 22 is used to download stored information, such as information stored in the RAM 16 to another data storage device or a computer, such as a personal computer system well known to those skilled in the art. In one embodiment, information stored in the memory (e.g., the RAM 16) is transmitted to a computer (not shown) operating according to the methods of the present invention, which analyzes and processes the information. In addition to the communications port 22, the processor 12 also includes a data input port 24 for receiving sensor data, as described in more detail below.

In the presently preferred embodiment, the processor based system 10 comprises a relatively small and unobtrusive device for collecting and storing motor data and displaying motor speed. The motor data may also be downloaded, transmitted, or otherwise transferred to another computer or motor monitoring system (not shown), for additional processing. However, it will be apparent to those of ordinary skill in the art that the system 10, as opposed to being a relatively small and unobtrusive data collection and storage device, could also comprise a more sophisticated device, such as a personal or laptop computer. Also, variations in the input/output components of the system 10 may be made depending upon particular applications. For example, in some applications, both a printer and a video display 20 may be desired, especially in situations in which the motor speed output is transmitted to a motor monitoring system for motor health evaluation. In other applications, a keyboard, as opposed to the small keypad 18 may be desired. It should, therefore, be clearly understood by those skilled in the art that the present invention is not limited to the particular hardware configuration shown in FIG. 1 but may be implemented using any type of hardware configuration suitable for determining motor shaft speed by the indicated methods. The processor based system 10 may comprise a personal computer, or any other suitable type of computer, such as a lap-top computer, mini-computer, main frame computer or the like.

The above-described system 10 is employed for on-line monitoring of the speed of a single phase or polyphase motor, the polyphase motor being illustrated schematically as a three-phase motor 30. Although equally useful for determining the speed in a single phase motor, in the preferred embodiment, the present invention is directed particularly to analyzing the performance and operating condition of a three phase induction motor 30 using only the phase angles of motor current and voltage, and RMS (root mean square) motor current amplitude.

In the preferred embodiment, the motor 30 is connected to a suitable power source 32 utilizing a suitable three-phase cable 34 carrying electrical current 35 having individual conductors or supply lines, including an a-phase conductor 34a, a b-phase conductor 34b, a c-phase conductor 34c, and if appropriate, a neutral conductor 34n. The three phase cable 34 carries phase a, b and c electrical currents 35a, 35b, 35c.

The output of the motor 30 is connected through a suitable output shaft or other type of mechanical transmission mean 36 to a load 38 which may be a fan, pump, compressor, valve or virtually any other type of machinery or equipment. Depending upon the application, the transmission means or transmission 36 may include suitable clutches, gearing, belts or other mechanical interconnecting devices (not shown) of a type well known in the art. For the sake of brevity, the combination of the motor 30, transmission 36, and the load 38 will herein sometimes be collectively referred to as the motor system 39. It should be appreciated by those skilled in the art that the present system 10 may be employed for determination of the speed of induction motors which may be connected to any suitable type of power source 32 for driving any type of load 38 (even no-load) utilizing any type of transmission means 36, and that the embodiment shown in FIG. 1 is only for the purpose of illustrating a preferred embodiment of the structure and operation of the present invention.

The preferred embodiment of system 10 further includes a plurality of individual sensors or probes shown collectively as 40, for monitoring predetermined electrical variables of the motor 30, and for converting the monitored characteristics into current and voltage sensor output signals 41, 47 for processing by the processor 12. In the present embodiment, the sensors 40 include three clamp-on current probes 42, 44, 46, one of the current probes being clamped to each of the conductors 34a, 34b, 34c, of the three-phase cable 34 interconnecting the motor 30 with the power source 32 for sensing the three-phase electrical current signals 35a, 35b, 35c. The clamp-on current probes 42, 44, 46 are generally of a type well known in the electrical measurement art and are commercially available from a variety of well known sources. The current probes 42, 44, 46 can be inductive or Hall effect or any other type which converts current in a conductor into proportional electrical signal. The electrical current signals 35a, 35b, 35c may also be transduced by current shunts or by current transformers instead of the clamp-on type of sensors. The probes may be applied to the motor circuit directly or to any control circuit which follows the phase currents proportionally and in a constant phase relationship. The present invention does not require correction or compensation for amplitude and phase shifts caused by the sensors, described in more detail below. Since current probes are known to those of ordinary skill in the art, complete details of the structure and operation of the current probes 42, 44, 46 are unnecessary for a complete understanding of the present invention and details may be obtained from the manufacturer.

The sensors 40 of the preferred embodiment further include voltage probes 48, 50, 52, each of which is connected to one of the conductors 34a, 34b, 34c of the three phase cable 34 and, if a neutral conductor 34n, shown in phantom, is present, a fourth voltage probe 54 is connected to the neutral conductor 34n of the cable 34. The voltage probes 48, 50, 52, 54 are generally of a type well known in the art and are commercially available from a variety of sources. For larger power systems with higher voltages, direct connection of the voltage probes 48, 50, 52 to the individual phase conductors 34a, 34b, 34c is generally impractical, and thus, potential transformers (not shown) may be used which reduce the voltage at the electrical signals 35a, 35b, 35c at the measurement point. The probes 48, 50, 52 are still used, but are connected to the,output of the respective potential transformer instead of directly to each of the individual phase conductors 34a, 34b, 34c. As discussed in more detail below, even if the voltage probes 48, 50, 52 are connected to a transformer, the present invention does not require compensation for such phase shifts as occurs when using wye-delta and delta-wye transformers which introduce a 30° phase shift. Since voltage probes are generally commercially available and known to those of skill in the art, further details of the structure and operation of the voltage probes 48, 50, 52, 54 are not necessary for a complete understanding of the present invention.

The preferred embodiment of system 10 further includes a plurality of signal conditioners 62 which are illustrated collectively in FIG. 1. Preferably, a separate signal conditioner is provided for each of the sensors 40, with the respective current sensor output signals 41 and voltage sensor output signals 47 being connected directly to the input of the respective signal conditioner 62. Each of the signal conditioners 62 functions in a manner well known in the art to amplify, impedance match, filter and otherwise standardize and improve the current sensor output signals 41 and voltage sensor output signals 47 received from the sensors 40. Standardization of signals includes conversion of currents to a proportional voltage, amplitude scaling and appropriate filtering to limit bandwidth. The precise structure and operation of each signal conditioner depends upon the particular type of sensor 40 with which the signal conditioner 62 is employed. Preferably, each of the signal conditioners 62 also includes an anti-alias low pass filter which functions to improve the integrity of the acquired sensor data by filtering out, prior to digitizing, sensor signal frequencies greater than approximately half of the sampling rate of the digitizer.

The preferred embodiment of system 10 further includes a plurality of individual analog-to-digital (A/D) converters 64 shown collectively in FIG. 1. The A/D converters 64 function in a manner well known in the art to receive the conditioned and filtered analog output signals from the corresponding signal conditioner 62 and convert the received analog signals at a predetermined sampling rate into digital signals (i.e., a stream or array of digital data) for data manipulation and analysis by the processor 12. A typical sampling rate could be 1,000 samples per second for each signal. Thus, each of the A/D converters 64 produces an output data array or bit stream corresponding to the particular sensor 40 with which the analog-to-digital converter is associated.

The outputs of each of the A/D converters 64 are provided to the input of a multiplexer 66. The multiplexer 66 which, in the present embodiment is preferably a time division multiplexer, receives the digital data signals from each of the A/D converters 64 and in a manner well known in the art transmits the received digital data signals to an appropriate data input port 24 of the processor 12 in a predetermined time spaced order. It will be appreciated by those skilled in the art that the signal conditioners 62, A/D converters 64, and multiplexer 66 which are employed in connection with the presently preferred embodiment, are each of a type well known in the art and available from a variety of manufacturers. Complete details of the structure and operation of the signal conditioners 62, A/D converters 64, and multiplexer 66 are generally well known and need not be described in greater detail herein. Suffice it to say that the signal conditioners 62, A/D converters 64, and multiplexer 66 cooperate to take the raw analog output current sensor output signals 41 and voltage sensor output signals 47 from the electrical sensors 40 and convert the raw signals into a digital form suitable for processing by the processor 12. It will be appreciated that the functions of the signal conditioners 62, A/D converters 64, and multiplexer 66 may be combined into a single sub-assembly or may be performed in any of several different manners. Moreover, the arrangement of the component parts may vary from what is shown in FIG. 1, for instance, the analog current sensor output signals 41 and voltage sensor output signals 47 provided by the sensors 40 could be multiplexed prior to being converted to digital signals by the A/D converters 64. Thus, while the preferred embodiment employs such components, the particular components are not intended to be a limitation on the present invention.

The processor 12 receives and processes the digital signals from the A/D converters 64 and stores the digital data signals in the RAM 16. In the presently preferred embodiment, each of the conditioned and digitized signals from each of the three current probes 42, 44, 46, and from the three voltage probes 48, 50, 52 are individually analyzed and processed by the processor 12. As will be appreciated, the processor 12 operates in accordance with the processor software, preferably stored in the ROM 14 or otherwise stored and accessible for execution by the processor 12. Alternatively, the present invention may be implemented using other means, such as hard-wired logic circuits (not shown) used in combination with or instead of the processor and software.

Figure 2:
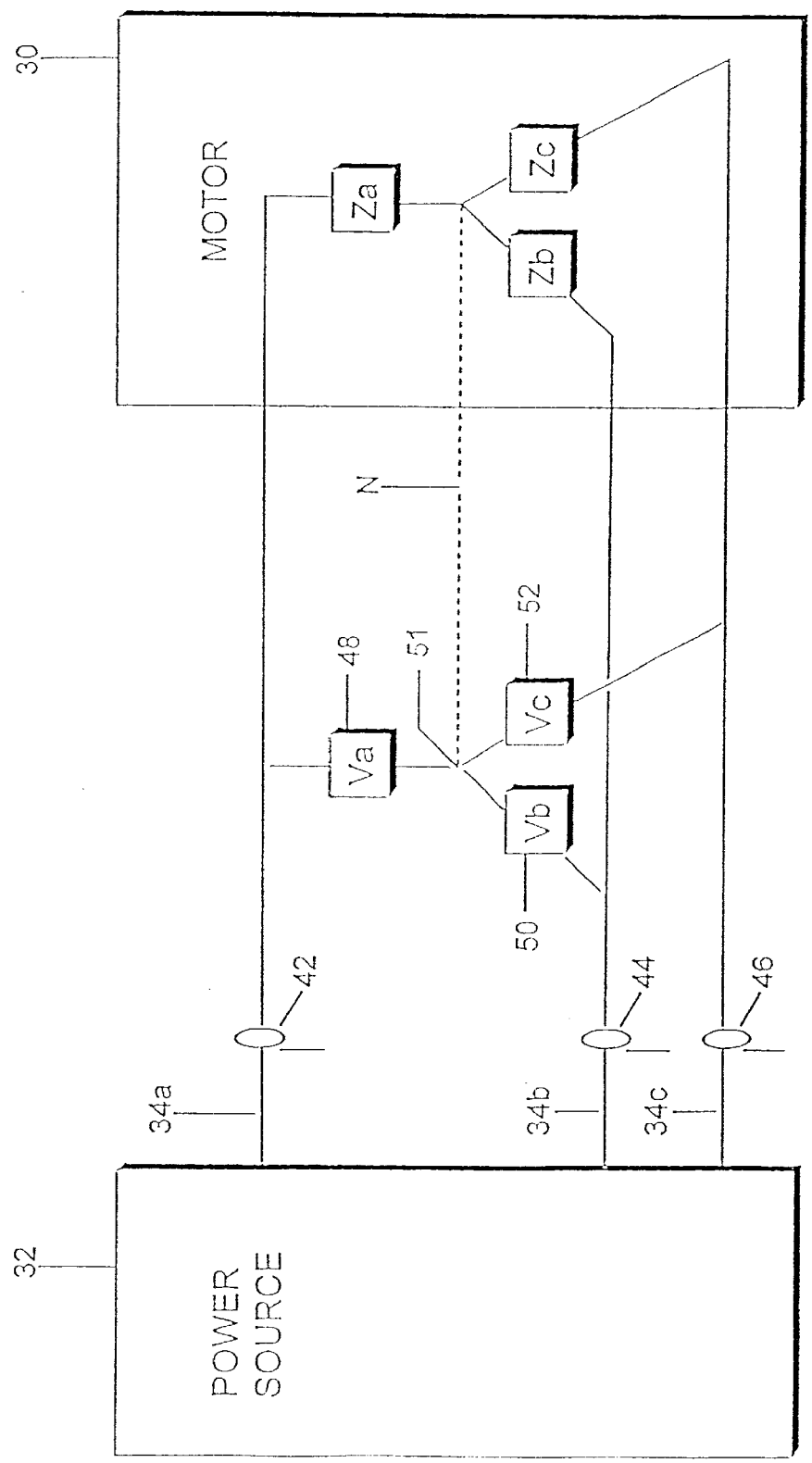
FIG. 2 is a more detailed functional schematic diagram of a portion of the system shown in FIG. 1.

FIG. 2 shows in greater detail the manner in which the motor electrical current 33 is sensed. In the illustrated embodiment, both the motor 30 and the voltage probes 48, 50, 52 are connected in a wye configuration, with an artificial neutral phase for measuring the phase-to-neutral voltage. One terminal of each of the voltage probes 48, 50, 52 is physically connected to each of the individual phase conductors 34a, 34b, 34c, respectively, with the other terminals of the voltage probes 48, 50, 52 being connected together at point 51 to form an artificial neutral. An optional neutral connection line (N) shown in phantom may be connected to the neutral of the motor circuit when the motor circuit is accessible.

The input wye circuit provides the capability to deal with both three and four wire wye motor configurations. When no external neutral (n) connection is made, the common "star point", indicated at 51, of the 3-wire wye circuit is driven to the algebraic mean of the three voltage inputs $V_a$, $V_b$, and $V_c$. That is, the star point 51 automatically assumes the "pseudo-neutral" potential (proper neutral for a balanced system). This allows the wye circuit to function as a "line-to-line to phase-to-neutral converter". The wye configuration has been found to work well, and is preferred, for 3-wire wye, 4-wire wye, and delta configured motors. In the delta and 3-wire wye configured cases, the neutral (N) is not connected. Although for delta and 3-wire wye configured motors measured with a wye apparatus the individual phase-to-neutral values are artificial, the individual current and line-to-line voltage measurements are accurate, as are the total power factor, total power factor angle, total real power, total reactive power, and all measurements based on these measurements. In the case of a motor configured as a 4-wire wye, if the neutral (N) is connected as shown in FIG. 2, all measurements are accurate, including phase-to-neutral measurements. It should be understood that while the voltage probes 48, 50, 52 illustrated in the present embodiment are preferably connected in a wye configuration, other connections, such as a delta type connection may be used.

Figure 3:
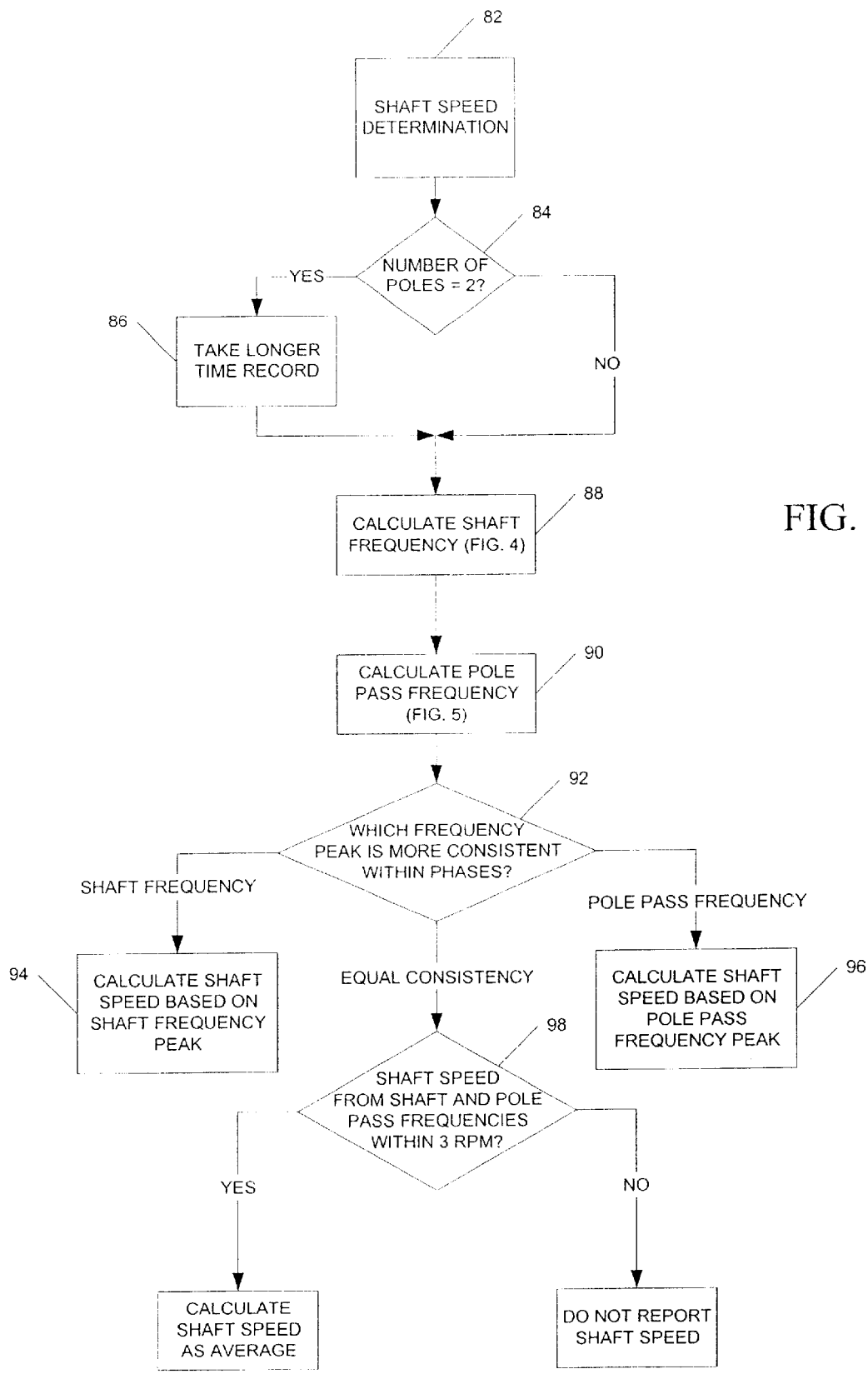
FIG. 3 is a flow diagram of a preferred method of determining the shaft speed from the shaft frequency and pole pass frequency in accordance with the system of FIG. 1.
Figure 4:
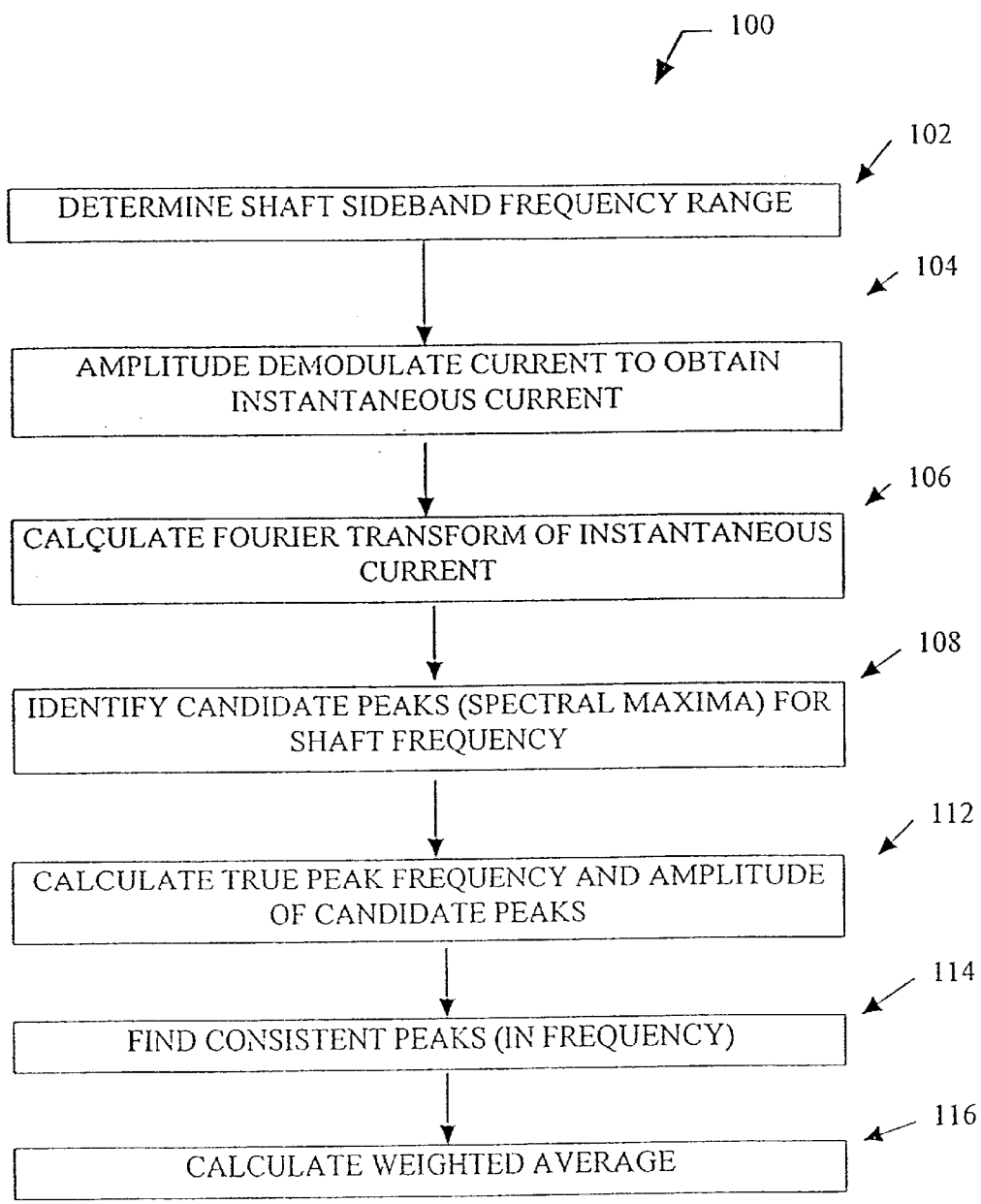
FIG. 4 is a flow diagram of a preferred method of determining the shaft frequency utilizing the frequency spectra of the demodulated motor current in accordance with the system of FIG. 1.
Figure 5:
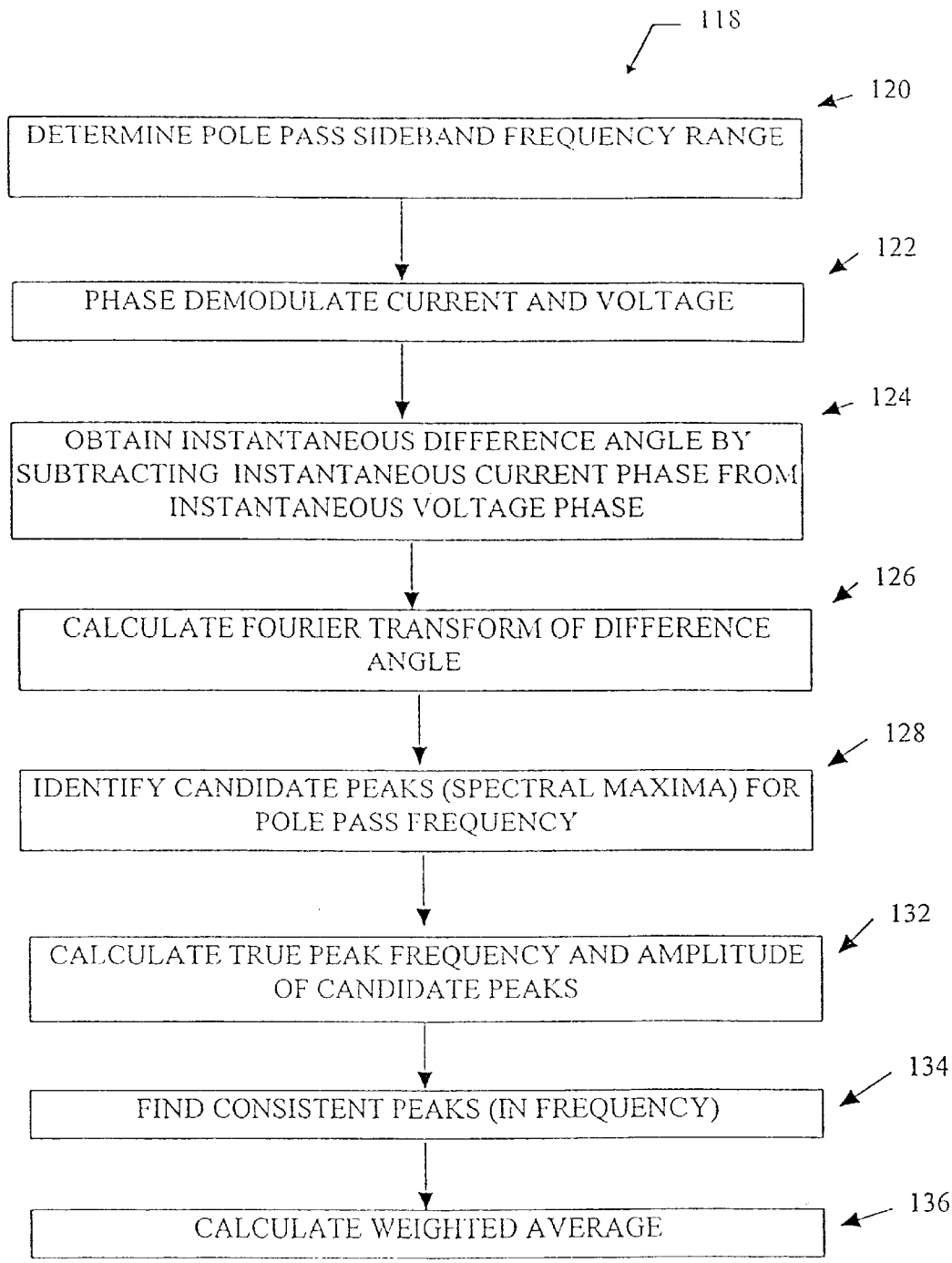
FIG. 5 is a flow diagram of a preferred method of determining the pole pass frequency utilizing the frequency spectra of the phase difference of the demodulated motor voltage and current in accordance with the system of FIG. 1.

FIGS. 3–5 are flow diagrams of methods of the present invention, which are readily implemented in software, which may be executed by the processor 12 or which may be executed on a computer, such as a personal computer, to which the data collected by the sensors 40 and stored in the computer memory has been transferred. In the presently preferred embodiment, the processor based system 10 collects and stores the data collected by the sensors 40. The collected and stored data is then processed by a processor 12 loaded with software implementing the data analysis methods of the present invention for determining the speed of the motor 30. The processor 12 manipulates the sampled digital data received from the electrical sensors 40 in a manner hereinafter described and generates highly accurate motor shaft speed in the form of discrete data. Although the steps in the flow diagrams are shown as being executed sequentially, it will be understood by those of ordinary skill in the art that at least some and possibly many of the steps may be implemented in parallel and are not necessarily dependent upon the prior step shown in the flow diagram being executed first. Accordingly, the present invention is not meant to be limited to performing each of the steps shown in the exact sequence shown.

As previously discussed, the sensors 40 and related hardware (signal conditioners 62 and A/D converters 64) often introduce phase shifts or time delays between the current probes 42, 44, 46 and their respective voltage probes 48, 50, 52. One of the features of the present invention is that, for stand alone operation, it is not necessary to compensate for phase shifts due to various components as long as the phase shifts and time delays are constant.

As discussed previously, the accurate determination of shaft frequency (or equivalently slip) is critical to assessing the satisfactory operation of motors. In the preferred embodiment, shown in FIG. 3, the shaft frequency or slip is determined by measuring the shaft frequency and/or pole pass frequency of the motor, where:

$$\text{Slip}=1-(\text{Shaft Frequency}/f_{synch}) \quad (1)$$

$$=(\text{Pole Pass Frequency}/2) \cdot f_{line} \quad (2)$$

where:

$$\text{Shaft Frequency}=\text{Shaft Speed}/60; \quad (3)$$

Shaft Speed=the motor speed in revolutions per minute (RPM); (4)

Shaft Frequency=the rotating rotor field frequency in Hz.; (5)

$$\text{Pole Pass Frequency}=(f_{synch}-\text{Shaft Frequency}) \cdot P \quad (6)$$

$f_{line}$=the power line frequency in Hz.; (7)

$f_{synch}=(2 \cdot f_{line})/P$, the rotating stator field frequency in Hz.; (8)

P=number of poles; and (9)

$$\text{Shaft Speed}=(1-(\text{Pole Pass Frequency})/2 \cdot f_{line})f_{synch} \cdot 60. \quad (10)$$

FIGS. 4 and 5 are flow diagrams of the preferred methods of determining the shaft frequency and pole pass frequency respectively. It will be understood by those of ordinary skill in the art that program flow diagrams or charts can represent various degrees of program operational details, ranging from high-level flow diagrams which show the principles embodied by the program to low-level flow diagrams which detail each step of the program operation. FIGS. 3–5 are high-level flow diagrams. However, it will be understood by those of skill in the art from this disclosure that a computer program can be written which embodies the principles set forth by this disclosure. Further, the preferred embodiment of the invention disclosed herein is described with reference to specific values or numbers of time samples, etc., such as a sampling rate of 1000 samples per second. It should be understood that such values are provided for the sake of example only and are not meant to limit the invention, as the specific values are not critical. The values may vary and are adjusted for various applications. For example, an acquisition of 32,768 data samples at 1000 samples per second may be used because it provides a reasonable bandwidth (400 Hz), a sufficiently long time record (32.768 seconds) for adequate frequency resolution and because a power of two lends itself to rapid calculation using the Cooley-Tukey Fast Fourier Transform (FFT) algorithm (discussed below).

FIG. 3 illustrates the preferred embodiment of the method involved in shaft speed determination 82 by independent measurement of the pole pass frequency and the shaft frequency. In accordance with step 84, the user is initially requested to enter the number of poles in the motor 30. If the user enters any number of poles other than two, then a predetermined number of samples is taken (e.g., 32,768) at a predetermined rate (e.g., 1000 samples per second). If the user enters the number of poles as two, a longer time record (e.g. 65,536 samples) is taken at step 86 in order to resolve the shaft speed indicating frequencies which lay very close to the second harmonic of the line frequency.

The shaft frequency and pole pass frequency are found as sidebands of the line frequency. Once the data samples have been collected, the frequencies of the shaft frequency sideband and pole pass frequency sideband are calculated in steps 88 and 90 of FIG. 3 in accordance with the method of FIGS. 4 and 5, respectively. A consistency check 92 is then performed for the shaft frequency and pole pass frequency calculated in steps 88 and 90 and the shaft speed is calculated and output 94, 96 to the display 20 or other suitable output device based on either the frequency of the shaft frequency sideband or the pole pass sideband, whichever is more consistent among the three electrical phases 34a, 34b, 34c. If the shaft frequency and pole frequency are equally consistent, the shaft speed is calculated from the shaft frequency and pole pass frequency 98. If the shaft speeds calculated from the shaft frequency and the pole pass frequency are within three Hz. of each other, the shaft speed is output as the average of the calculated shaft speeds; if the calculated shaft speeds are inconsistent with each other, the shaft speed is not reported.

The shaft frequency determination routine of the preferred embodiment, shown in FIG. 4 as process 100, analyzes the electrical current of the three line phases 34a, 34b, 34c to calculate the shaft frequency. Initially, in step 102, the possible frequency range of the shaft frequency is determined.

Figure 6:
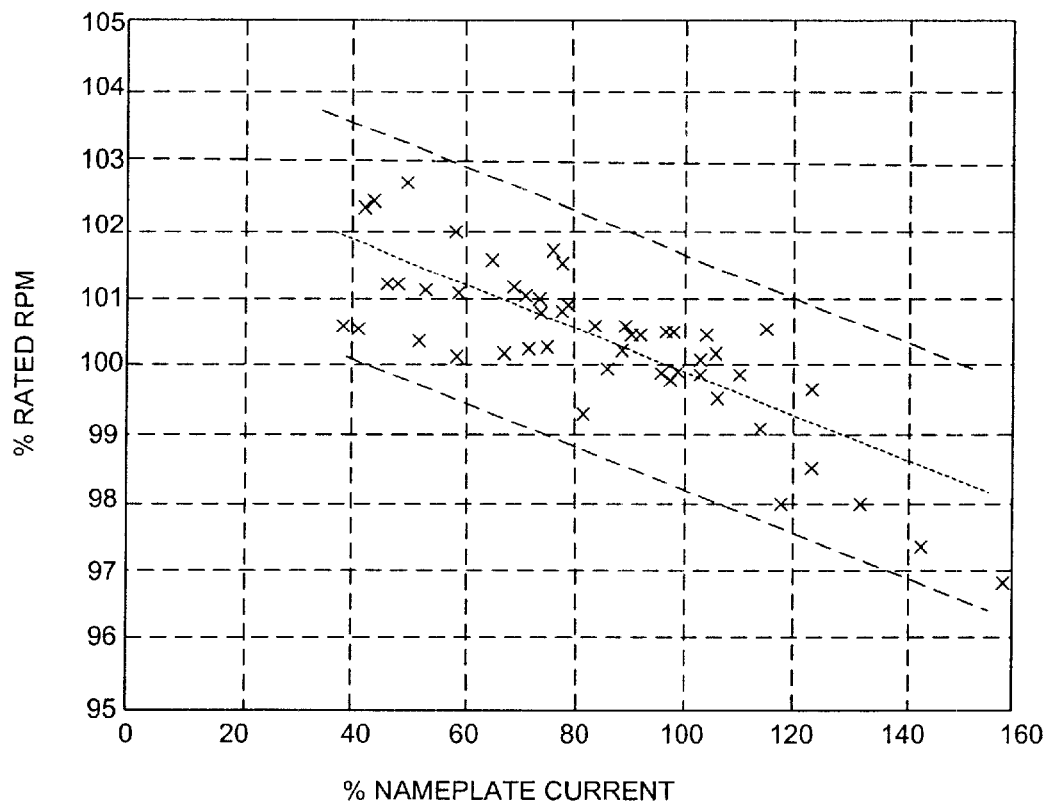
FIG. 6 is scatter diagram of motor shaft speed plotted as a percentage of rated motor shaft speed vs. motor current plotted as a percentage of motor nameplate current.

The range of frequencies to be used for detecting the shaft and pole pass frequencies can be determined from the current drawn by the motor 30 in relation to the motor nameplate current as a function of the shaft speed in relation to the rated shaft speed (rated RPM) of the motor. FIG. 6 is a scatter diagram of experimental data points of motor shaft speed as a percentage of rated RPM vs. current as a percentage of nameplate current for a quantity of induction motors. Fitting the experimental data to a straight line by a linear regression calculation results in the expression:

% rated RPM=103.0714−0.0316·% rated current

The standard error of Y (% motor current) on X (% RPM) of the data set of FIG. 6 was found to be 0.5832. Defining the range over which the shaft speed would be found as ±three standard errors relative to the regression line, the upper and lower limits of shaft speed can be expressed as:

$$\text{RPM}_{Lower}=((\% \text{ rated RPM}-3 \cdot 0.5832) \cdot \text{rated RPM})/100 \quad (11)$$

$$\text{RPMY}_{Upper}=((\% \text{ rated RPM }+3 \cdot 0.5832) \cdot \text{rated RPM})/100 \quad (12)$$

Based on Equation (3), the lower bound of shaft frequency is:

$$\text{Shaft Frequency}=\text{RPM}_{Lower}/60 \quad (13)$$

The upper bound on the shaft frequency for motors having more than two poles is:

$$\text{Shaft Frequency}_{Upper}=\text{lesser of } (\text{RPM}_{Upper}/60, f_{synch}-\Delta f) \quad (14)$$

where:

Shaft Frequency$_{Upper}$=the shaft frequency sideband upper bound in revolutions per second; (15)

RPM$_{Upper}$=the motor shaft speed upper bound in revolutions per minute; (16)

f$_{synch}$=the synchronous frequency of the motor n revolutions per second from Equation 8; (17)

The upper bound on the shaft frequency for two pole motors is:

Shaft Frequency$_{Upper}$=lesser of (RPM$_{Upper}$/60, f$_{synch}$−10·Δf) (18)

where Δf=the reciprocal of the measurement time interval in seconds$^{-1}$; (19)

The Δf and 10·Δf factors employed in Equations 14 and 18 respectively are used to prevent the shaft frequency (and pole pass frequency) from equaling or exceeding the synchronous frequency. The factors are necessary to cope with artifacts in the frequency spectrum introduced by spreading of the synchronous frequency spectrum line. The artifacts are caused by a combination of the finite measurement time interval and windowing. In addition to a larger offset (10·Δf), a longer acquisition period, i.e., 65,536 samples, is used for two pole motors because of the difficulty in detecting shaft frequency peaks due to the possible interference of the line frequency second harmonic.

For particular kinds of motors, the upper and lower limits defined by Equations 11–18 can be adjusted for customized refinement. The parameters described in FIG. 6 and Equations 11–18 are shown as examples of how the parameters can be obtained in a practical manner, and to provide default values that are generally very effective.

At step 104, of the preferred embodiment the current sensor output signals 41 are amplitude demodulated to produce an instantaneous root-means-square (RMS) value of current at every sampling instant for each motor phase of the current sensor output signal 41. Amplitude demodulation of the current sensor output signals 41 can be accomplished by the processor 12 by any standard demodulation technique. The preferred demodulation technique is to calculate the Fast Fourier Transform (FFT) of the current sensor output signal 41, zero the DC component, the components at frequencies above the folding frequency and the components at the negative frequencies, double the amplitude of the components at the remaining positive frequencies, and then, calculate an inverse FFT. The aforementioned process 104 results in a complex time domain signal known as the analytic signal. The instantaneous amplitude of the current sensor output signal 41 is then found from the square root of the sum of the squares of the real and imaginary parts of the analytic signal output of the inverse FFT process.

An acceptable alternative means of demodulation that does not require transformation to the frequency domain is convolution of the current sensor output signal 41 with a 90 degree phase shifting, all pass finite impulse response (FIR) filter known as the Hilbert transformer. The result of the convolution is a new time domain signal that is 90 degrees out of phase with the original signal. If the original time domain signal is treated as the real component of an analytic signal and the new quadrature (90 degrees out of phase) signal is treated as the imaginary part of an analytic signal the instantaneous RMS current sensor output signal 41 is found as the square root of the sum of squares of the real and imaginary parts of the analytic signal, as in the frequency domain technique.

It will be appreciated by those skilled in the art that the two amplitude demodulation methods discussed are preferred but are not limiting. Any method that produces an accurate measure of the instantaneous amplitude of the current sensor output signal 41 can be used. However, any method selected employing a finite number of data samples will produce undesirable "end effects," that is, highly distorted data near the ends of the data blocks. An acceptable means of overcoming end effects is to discard the first and last 2,048 points from each data block, leaving 28,672 samples when there are more than 2 pole motors and 61,440 samples for 2 pole motors. 4,096 zeroes can be added at the end of the data block to bring the total length back up to a power of two so that the Cooley-Tukey algorithm can be used. The preferred method, however, is to collect more data than needed, then, after demodulation, discard the end point data to bring the total back to 32,768 samples (65,536 samples for two pole motors). Another acceptable alternative is to use a mixed radix (non-power of 2) FFT algorithm.

In the preferred embodiment of the motor speed monitor, spectral analysis on the instantaneous RMS current values is conducted at step 106 to generate a frequency spectrum for all three phases 34a, 34b, 34c. The procedure might be performed, for example, on 32,768 samples of instantaneous RMS data. In preparation for the spectral analysis, 106, the DC component is first calculated as the average value of the RMS current signal over the 32,768 points. The DC component is then subtracted from the data to eliminate DC offset. A window is then applied to the instantaneous RMS current signal data points by multiplying the 32,768 point signal data set by an equal length standard FFT window, such as the Kaiser-Bessel window. The Kaiser-Bessel window is preferred because it provides superior selectivity in the frequency domain. An acceptable but not preferred window is the Hanning window. The spectral analysis is performed by a standard FFT algorithm, dividing each resulting spectra amplitude component by N, where N is the number of points in the FFT. If, after the windowing is performed, the data length is not a power of two, either a mixed radix FFT routine can be used, or by padding the instantaneous RMS current signal with zeros in order to extend the length to the next power of two, the Cooley-Tukey power-of-two FFT can be used.

Following the FFT process, adjustments are then made to the frequency spectrum amplitude components to compensate for window effects (e.g., a factor of 2 compensates for the Hanning window). Finally, a one-sided frequency spectrum is calculated by eliminating the negative frequency components, doubling all of the remaining (positive) components and selecting the spectral lines from DC to the folding frequency (half sampling rate). It will be appreciated by those skilled in the art that other methods than a FFT with a Kaiser-Bessel window may be used for obtaining the frequency spectrum of the instantaneous current. For example a filter bank or a chirp z transform may be used without departing from the spirit and scope of the invention.

In the preferred embodiment in step 108, all local maxima are found within the frequency range. To qualify for further consideration, a peak must pass two tests: (1) the closest two spectral lines on both sides of a peak must monotonically decrease away from the peak; and (2) the peak must be discrete. The preferred way of testing for discreteness is to require that the amplitude of the second spectral line on both sides of the peak be at least 5 decibels below the peak amplitude.

An alternative method of testing for discrete peaks is to measure the noise floor by calculating the RMS of the spectrum in the shaft frequency range, ignoring spectral components within three spectral lines of any local maximum that are within 12 decibels of the highest peak. Any peak whose amplitude at a point halfway to the noise floor is greater than the FFT window roll-off plus a tolerance for noise is eliminated from further consideration as being non-discrete.

The highest amplitude qualifying peak is accepted as a candidate peak. The next highest amplitude qualifying peak in the range is then examined. If it is within 4 decibels of the highest candidate peak, it is accepted as the second candidate peak. If not, then there is only one candidate peak. The candidate peaks from each electrical phase are subsequently used to determine shaft frequency.

At step 112 of the preferred embodiment; the true frequency and magnitude of the candidate peaks are determined by calculating the picket fence corrections for the Kaiser-Bessel window. For isolated peaks well above the noise level, the picket fence procedure identifies the true frequency and amplitude of a peak with high accuracy. Picket fence corrections are explained in detail below.

For a Kaiser-Bessel window, the picket fence corrections are performed for each candidate peak as follows:

(a) Locate the highest peak in the range bounded by the upper and lower limits and find the frequency and amplitude corresponding to that peak (denoted as est__freq and est amp respectively). If a peak consists of two points of the same amplitude, True peak frequency=frequency corresponding to left point+Δf/2; (20)

True peak amplitude=amplitude of left point (or right)+1.0175 decibels; (21)

(b) check the amplitudes of the closest spectral lines on both sides of the highest peak, then:
  1) set flag=−1 if the line on the left of the highest peak is higher than the line on the right, or
  2) set flag=+1 if the line to the right of the peak is higher than the line to the left of the peak, or
  3) if both the line on the left of the peak and the line on the right of the peak have equal amplitudes, then no corrections are required;

(c) calculate del__db=amplitude of highest peak -amplitude of next highest peak (del__db is always positive);

(d) calculate del__fc as:

del__fc=((−0.120583213·del__db)+0.498649196)·Δf (e) calculate the true frequency as:

True frequency=est__freq+del__fc, if flag=+1; (22)

True frequency=est__freq−del__fc, if flag=−1; (23)

(f) calculate the amplitude correction as:

del__L=(−0.060538416 (deldb)²)+(0.495432455·del__db)+1.01575381

(g) calculate the true peak amplitude as:

True peak amplitude=est__amp+del__L. (24)

Step 114 in the preferred embodiment finds consistent peaks and eliminates outlying peaks between the three line phases 35a, 35b, 35c. The highest and next highest candidate peaks from each phase are given equal weight. Peaks from the different phases 35a, 35b, 35c are considered consistent if the true peak frequencies are within 0.1 Hz of each other and occur in at least two phases. If there is more than one consistent set of peaks between the motor phases, the shaft frequency is not calculated. The shaft speed is then derived from the pole pass frequency. Only sets of peaks that are consistent in at least two phases are retained and the rest discarded.

Finally, in step 116, a best estimate of the shaft frequency is determined by averaging the true peak frequency of the phases 35a, 35b, 35c weighting each true peak frequency value in proportion to amplitude squared of each peak.

The pole pass frequency detection routine is shown in FIG. 5 as process 118. The procedure for determining pole pass frequency is similar to the aforedescribed procedure for determining the shaft frequency. The upper bound on the pole pass frequency is calculated as:

Pole Pass Frequency$_{Upper}$=P·(f$_{synch}$−RPM$_{Lower}$/60); (25)

The lower bound is calculated as:

Pole Pass Frequency$_{Lower}$=higher of (P·(f$_{synch}$−RPM$_{Upper}$/60), 10·Δf) (26)

Step 122 of the preferred embodiment phase demodulates the current sensor output signals 41 and voltage sensor output signals 47 to produce an instantaneous phase value for each current and voltage output signal 41, 47 at every sampling instant. The demodulation process is the same as used to derive the RMS current values, step 102, i.e. generating an analytic representation of the signals 41, 47. However, rather than calculating the instantaneous amplitude from the real and imaginary components of the analytic signal, the phase is calculated from those same components. The phase is found by computing the four quadrant arctangent of the imaginary component divided by the real component of the analytic signal. The result is a phase angle that ranges between −π and +π (or between 0 and 2π, depending on the convention used). However, in the preferred embodiment to prevent ambiguity, the phase is unwrapped, that is, allowed to increase beyond the normal −π to +π range as the angular change progresses. This prevents discontinuities and is preferred over the modulo π−2π phase representation.

Once the instantaneous phases of the current and voltage sensor output signals 41, 47 are obtained for each motor electrical current phase 35a, 35b, 35c the current sensor output signal phase 41 is subtracted from the voltage sensor output signal 47 phase to obtain a difference angle at step 124. The preferred representation for the current and voltage phase angles prior to subtraction is that of a continuous function of time in order to avoid discontinuities when expressing the angle modulo 2π. As mentioned above, the process of converting a modulo 2π angular representation to one expressing the angle as a continuously increasing or decreasing function is known as phase unwrapping in signal processing. It is accomplished by adding 2π to the angle when crossing from π to −π, and subtracting 2π from the angle when crossing from −π to π. The rest of the pole pass frequency determination process, steps 126–136, are the same as the shaft frequency determination process, steps 106–116, wherein step 126 corresponds to step 106, step 128 corresponds to step 108, and so on.

Referring back to FIG. 3, at decision block 84, before calculating the shaft and pole pass frequencies, the number of motor poles is determined. If the number of motor poles is unknown, it is calculated for induction motors by the steps of: (a) dividing the line frequency by the nominal or approximate or nameplate shaft frequency, (b) rounding the result to the next lower integer, and (c) multiplying the result by two.

In the preferred embodiment selection of the most consistent frequency set of peaks is performed at step 92 in FIG. 3. After detecting the pole pass and the shaft frequency peak for each electrical current phase 35a, 35b, 35c the peak that occurs more consistently between the electrical current phases 35a, 35b, 35c is selected for shaft speed calculation and for outputting in a shaft speed report. For example, if the selected shaft frequency peak occurs in phases a and b 34a, 34b while the selected pole pass frequency peak occurs in phases a, b and c 34a, 34b, 34c, then the pole pass frequency is selected to estimate shaft speed 96. Similarly, if the shaft frequency peak is of greater consistency, the shaft speed is calculated from the shaft frequency 94. In case the pole pass frequency peak and the shaft frequency peak are of equal consistency, the shaft speed estimates calculated (in RPM) from both the shaft frequency and pole pass frequency are compared 98. If the shaft speed estimates are within 3 RPM of each other, the shaft speed is reported as the average of the shaft speeds calculated from the pole pass and frequency peaks. If the shaft speed estimates are not within 3 RPM of each other, the shaft speed is not reported. If neither the shaft frequency nor the pole-pass range has a qualifying peak, then shaft speed can not be computed and is not reported.

Table 1 illustrates the application of equations 13–14 and 25–26 in determining non-overlapping shaft frequency and pole pass frequency ranges for motors having 10 poles or more and for shaft speed ranges between $RPM_{Upper}=f_{synch} \cdot 60$ and $RPM_{Lower}=0.985 \cdot$ Rated RPM. It is clear from this table that the preferred embodiment of the present invention is an improvement over the method disclosed in U.S. Pat. No. 6,144,924.

From the foregoing description, it can be seen that the present invention comprises an improved method and apparatus for on-line determination of motor speed in single and polyphase electrical motors. It will be appreciated by those skilled in the art that changes could be made to the embodiment described above without departing from the broad inventive concept thereof. It is understood, therefore, that this invention is not limited to the particular embodiment disclosed, but it is intended to cover modifications within the spirit and scope of the present invention as defined by the appended claims.

TABLE 1

| | Motor Characteristics | | | |
|---|---|---|---|---|
| Number of Poles | Synchronous Speed (RPM/Hz) | Typical Rated Speed (RPM) | Pole Pass Frequency Lower and Upper Boards (Hz) | Shaft Frequency Lower and Upper Boards (Hz) |
| 10 | 720/12 | 710 | 0.3–3.44 | 11.66–12 |
| 12 | 600/10 | 585 | 0.3–4.76 | 9.6–10 |
| 14 | 514.3/8.57 | 505 | 0.3–3.93 | 8.29–8.57 |
| 22 | 327.3/5.45 | 318 | 0.3–5.15 | 5.22–5.45 |

We claim:

1. A method of determining a shaft speed of a motor by using an electrical signature of the motor, comprising the steps of:
    (a) sensing an electrical current supplied to the motor to generate a current sensor output signal for at least one electrical phase of the motor;
    (b) demodulating the current sensor output signal for a predetermined time interval to obtain an instantaneous amplitude of the current sensor output signal;
    (c) generating a frequency spectrum of the instantaneous amplitude of the current sensor output signal;
    (d) finding at least one spectral peak of the instantaneous current amplitude frequency spectrum within a predetermined shaft frequency sideband range,
    wherein the predetermined shaft frequency sideband range extends between a shaft frequency sideband upper bound and a shaft frequency sideband lower bound, and wherein the predetermined shaft frequency sideband range is determined by the steps of:
        (d)(1) collecting over a measurement interval a set of data points representative of the relationship between: (i) one of the motor electrical current sensor output signal and a function of the motor electrical current sensor output signal and (ii) the motor shaft speed and a function of the motor shaft speed;
        (d)(2) determining a regression line from the collected set of data points;
        (d)(3) determining a shaft speed upper bound and a shaft speed lower bound based on the dispersion of the collected data points above and below the regression line;
        (d)(4) converting the shaft speed upper bound to the shaft frequency sideband upper bound by the expression:

$\text{ShaftFrequency}_{Upper}=\text{lesser of }(RPM_{Upper}/60, f_{synch}-\alpha \cdot \Delta f)$ where:

$\text{ShaftFrequency}_{Upper}$=the shaft frequency sideband upper bound in revolutions per second;

$RPM_{Upper}$=the motor shaft speed upper bound in revolutions per minute;

$f_{synch}$=a synchronous frequency of the motor in revolutions per second;

$\Delta$=a constant;

and $\Delta f$=a reciprocal of the measurement interval in seconds$^{-1}$;

(e) converting the shaft speed lower bound to the shaft frequency sideband lower bound by the expression:

$\text{ShaftFrequency}_{Lower}=RPM_{Lower}/60$ where:

$\text{ShaftFrequency}_{Lower}$=the shaft frequency sideband lower bound in revolutions per second, and $RPM_{Lower}$=the motor shaft speed lower bound in revolutions per minute;

(f) estimating a shaft frequency from the at least one spectral peak; and
    (g) converting the shaft frequency to shaft speed by the expression:

$RPM=\text{ShaftFrequency} \cdot 60$ where RPM is the shaft speed in revolutions per minute and ShaftFrequency is the estimated shaft frequency in revolutions per second.

2. The method of claim 1 wherein the constant a is a function of the number of poles in the motor, selected to reduce the effects of artifacts in the frequency spectrum.

3. A method of determining a shaft speed of a motor by using an electrical signature of the motor, comprising the steps of:

(a) sensing an electrical current supplied to the motor to generate a current sensor output signal for at least one electrical phase of the motor;

(b) demodulating the current sensor output signal for a predetermined time interval to obtain an instantaneous amplitude of the current sensor output signal;

(c) generating a frequency spectrum of the instantaneous amplitude of the current sensor output signal;

(d) finding at least one spectral peak of the instantaneous current amplitude frequency spectrum within a predetermined shaft frequency sideband range;

(e) estimating a shaft frequency from the at least one spectral peak;

wherein the steps for estimating the shaft frequency comprise:

(e)(1) selecting at least one qualifying peak from the at least one spectral peak, wherein a qualifying peak is discrete and monotonically decreasing on both sides of the qualifying peak;

(e)(2) selecting a set of candidate peaks wherein the set of candidate peaks comprises the largest qualifying peak and the next largest qualifying peak having a magnitude within four decibels of the largest qualifying peak;

(e)(3) determining a true peak frequency and true peak amplitude for each candidate peak of the set of candidate peaks by performing a picket fence correction to the amplitude and frequency of each candidate peak;

(e)(4) comparing, pair-wise, the magnitude of the frequency difference between the true peak frequencies of the candidate peaks from each electrical motor phase with each other to determine the existence of a consistent set of true peak frequencies; and (e)(5) estimating the shaft frequency of the motor, if only a single consistent set of true peak frequencies exists, by taking the average of the true peak frequencies of the candidate peaks from the single consistent set and weighting the contribution of each true peak frequency by a function of each true peak amplitude; and (f) converting the shaft frequency to shaft speed by the expression:

$$RPM = ShaftFrequency \cdot 60$$

where RPM is the shaft speed in revolutions per minute and ShaftFrequency is the estimated shaft frequency in revolutions per second.

4. A method of determining a shaft speed of a motor by using an electrical signature of the motor, comprising the steps of:

(a) sensing an electrical voltage supplied to the motor to generate a voltage sensor output signal for at least one electrical phase of the motor;

(b) sensing an electrical current supplied to the motor to generate a current sensor output signal for at least one electrical phase of the motor;

(c) demodulating the voltage sensor output signal for a predetermined time interval to obtain an instantaneous phase of the voltage sensor output signal;

(d) demodulating the current sensor output signal for a predetermined time interval to obtain an instantaneous phase of the current sensor output signal;

(e) subtracting the instantaneous phase of the current sensor output signal from the instantaneous phase of the voltage sensor output signal to obtain an instantaneous difference angle;

(f) generating a frequency spectrum of the instantaneous difference angle;

(g) finding at least one spectral peak of the instantaneous difference angle frequency spectrum within a predetermined pole pass frequency sideband range;

(h) estimating a pole pass frequency from the at least one spectral peak; and (i) converting the pole pass frequency to shaft speed by the expression:

$$RPM = (1 - (PolePassFrequency / 2 \cdot f_{line})) \cdot f_{synch} \cdot 60$$

where: RPM=the shaft speed in revolutions per minute

PolePassFrequency=the estimated pole pass frequency in revolutions per second $f_{line}$=a frequency of the line voltage in cycles per second $f_{synch}$=a synchronous frequency of the motor in revolutions per second=$(2 \cdot f_{line})/P$ and P=number of motor poles.

5. The method of claim 4 wwherein the predetermined pole pass frequency sideband range extends between a pole pass frequency sideband upper bound and a pole pass frequency sideband lower bound, the steps for determining the predetermined pole pass frequency sideband range comprising:

(1) collecting over a measurement interval a set of data points representative of the relationship between: (i) one of the motor electrical current as a function of the motor electrical current and (ii) one of the motor shaft speed as a function of the motor shaft speed;

(2) determining a regression line from the collected set of data points;

(3) determining a shaft speed upper bound and a shaft speed lower bound from the dispersion of the collected data points around the regression line;

(4) converting the shaft speed lower bound to the pole pass frequency sideband upper bound by the expression:

$$PolePassFrequency_{Upper} = Poles \cdot (f_{synch-RPMLower}/60)$$

where:

$PolePassFrequency_{Upper}$=the pole pass frequency sideband upper bound in revolutions per second;

$RPM_{Lower}$=the motor shaft speed lower bound in revolutions per minute;

$f_{synch}$=the synchronous frequency of the motor in revolutions per second;

and Poles=the number of poles; and (5) converting the shaft speed upper bound to the pole pass frequency sideband lower bound by the expression:

PolePassFrequency$_{Lower}$=greater of (poles·(f$_{synch}$−RPM$_{Upper}$/60), α·Δf)

where:

PolePassFrequency$_{Lower}$=the pole pass frequency lower bound in revolutions per second, RPM$_{Upper}$=the motor shaft speed upper bound in revolutions per minute;

α=a constant;

and Δf=a reciprocal of the measurement interval in seconds$^{-1}$.

6. The method of claim 5 wherein the constant α is a function of the number of poles in the motor selected to reduce the effects of artifacts in the frequency spectrum.

7. The method of claim 4 wherein a Fourier transform is used in the demodulation steps to generate the instantaneous phase of the current sensor output signal and the voltage sensor output signal respectively.

8. The method of claim 4 wherein a Hilbert transform is used in the demodulation steps to generate the instantaneous phase of the current sensor output signal and the voltage sensor output signal respectively.

9. The method of claim 4 wherein the steps for estimating the pole pass frequency comprise:

(h)(1) selecting at least one qualifying peak from the at lest one spectral peak, wherein a qualifying peak is discrete and monotonically decreasing on both sides of the qualifying peak;

(h)(2) selecting a set of candidate peaks wherein the set of candidate peaks comprises the largest qualifying peak and the next largest qualifying peak having a magnitude within four decibels of the largest discrete qualifying peak;

(h)(3) determining a true peak frequency and true peak amplitude for each candidate peak by performing a picket fence correction to the amplitude and frequency of each candidate peak;

(h)(4) comparing, pair-wise, the magnitude of the frequency difference between the true peak frequencies of the candidate peaks from each electrical motor phase with each other to determine the existence of a consistent set of true peak frequencies; and (h)(5) estimating the pole pass frequency of the motor, if only a single consistent set of true peak frequencies exists, by taking the average of the true peak frequencies of the candidate peaks from the single consistent set and weighting the contribution of each true peak frequency by a function of each true peak amplitude.

10. The method of claim 4 wherein the current sensor output signal is generated from three of the at least one electrical motor phases.

11. A method of determining a shaft speed of a motor by using an electrical signature of the motor, comprising the steps of:

(a) estimating a shaft frequency by measuring at least one first spectral peak location in a first frequency spectrum of an amplitude demodulated motor electrical current;

(b) estimating a pole pass frequency by measuring at least one second spectral peak location in a second frequency spectrum of the difference between a phase demodulated motor electrical current and a phase demodulated motor electrical voltage;

(c) measuring the consistency of the shaft frequency and the pole pass frequency estimates respectively by comparing the at least one first spectral peak location and the at least one second spectral peak location in at least one motor phase;

(d) calculating and outputting the shaft speed based on the most consistent of the shaft frequency and the pole pass frequency estimates;

(e) calculating and outputting the shaft speed as the average of a first shaft speed calculated from the shaft frequency estimate and a second shaft speed calculated from the pole pass frequency estimate if the shaft speed estimate and the pole pass frequency estimate are equally consistent and if the first shaft speed differs from the second shaft speed by less than a predetermined limit; and (f) not outputting the shaft speed if the shaft frequency and the pole pass frequency are equally consistent and if the first shaft speed differs from the second shaft speed by a value equal to or greater than a predetermined limit.

* * * * *